United States Patent
Thompson et al.

(10) Patent No.: US 11,342,731 B1
(45) Date of Patent: May 24, 2022

(54) ELECTRICAL CONTROL PANEL WITH COOLING SYSTEM

(71) Applicant: PeopleFlo Manufacturing, Inc., Franklin Park, IL (US)

(72) Inventors: Michael P. Thompson, Chicago, IL (US); Daniel T. Turner, Heber City, UT (US); Clark J. Shafer, Bolingbrook, IL (US); William R. Blankemeier, Oak Park, IL (US)

(73) Assignee: PEOPLEFLO MANUFACTURING, INC., Franklin Park, IL (US)

( * ) Notice: Subject to any disclaimer, the term of this patent is extended or adjusted under 35 U.S.C. 154(b) by 0 days.

(21) Appl. No.: 17/152,489

(22) Filed: Jan. 19, 2021

(51) Int. Cl.
| | |
|---|---|
| *H02B 1/56* | (2006.01) |
| *H05K 7/20* | (2006.01) |
| *H02B 1/06* | (2006.01) |
| *H05K 5/02* | (2006.01) |

(52) U.S. Cl.
CPC ............ *H02B 1/56* (2013.01); *H02B 1/06* (2013.01); *H05K 5/0213* (2013.01); *H05K 7/202* (2013.01); *H05K 7/206* (2013.01); *H05K 7/20145* (2013.01); *H05K 7/20163* (2013.01); *H05K 7/20918* (2013.01)

(58) Field of Classification Search
CPC .... H05K 7/20163; H05K 7/202; H05K 7/206; H05K 7/20918
See application file for complete search history.

(56) References Cited

U.S. PATENT DOCUMENTS

| | | | |
|---|---|---|---|
| 3,559,728 A | 2/1971 | Lyman et al. | |
| 4,386,651 A * | 6/1983 | Reinhard .............. | H05K 7/206 165/104.34 |
| 6,125,926 A * | 10/2000 | Okamoto ................ | F28F 1/02 165/177 |
| 7,813,121 B2 | 10/2010 | Bisson et al. | |
| 8,325,479 B2 | 12/2012 | Siracki et al. | |
| 8,462,504 B2 | 6/2013 | Chen et al. | |
| 8,503,178 B2 | 8/2013 | Chen et al. | |

(Continued)

FOREIGN PATENT DOCUMENTS

| | | |
|---|---|---|
| DE | 3504227 | 1/1987 |
| DE | 3504227 C2 | 1/1987 |

(Continued)

*Primary Examiner* — Robert J Hoffberg
(74) *Attorney, Agent, or Firm* — Cook Alex Ltd.

(57) ABSTRACT

An electrical control panel including an enclosure box being sealed other than at an inlet opening and an outlet opening, a primary electrical component inside the enclosure box and having a first heat exchanger that transfers heat from the primary electrical component, one or more secondary electrical components inside the enclosure box that generate less heat than the primary electrical component, a second heat exchanger attached to the enclosure box and having an internal air passageway that includes an inlet opening and an outlet opening in fluid communication with the respective outlet and inlet openings of the enclosure box and defining therewith a sealed compartment, and one or more diverter elements direct a majority of the heated air from the first heat exchanger to enter the internal air passageway of the second heat exchanger without flowing over at least one of the secondary electrical components.

20 Claims, 9 Drawing Sheets

(56) References Cited

U.S. PATENT DOCUMENTS

| | | | |
|---|---|---|---|
| 9,313,918 B2 | 4/2016 | Lee et al. | |
| 9,516,784 B2 | 12/2016 | Pawar et al. | |
| 9,545,037 B2 | 1/2017 | Tyleshevski et al. | |
| 9,968,013 B2 | 5/2018 | Cacho Alonso | |
| 9,974,214 B2 | 5/2018 | Hamari et al. | |
| 10,111,360 B2 | 10/2018 | Perrin et al. | |
| 10,212,861 B2 | 2/2019 | Ashbaugh et al. | |
| 10,236,666 B2 | 3/2019 | Rothe | |
| 10,292,303 B2 | 5/2019 | Cacho Alonso et al. | |
| 10,292,305 B2 | 5/2019 | Greubel et al. | |
| 10,375,851 B2 | 8/2019 | Agnaou et al. | |
| 10,375,860 B2 | 8/2019 | Cacho Alonso | |
| 10,398,062 B2 | 8/2019 | Huang et al. | |
| 10,462,942 B2 | 10/2019 | Borisov et al. | |
| 10,638,639 B1 | 4/2020 | Garner et al. | |
| 2006/0243423 A1 | 11/2006 | Giacoma | |
| 2012/0181002 A1 | 7/2012 | Chen et al. | |
| 2016/0299544 A1 | 10/2016 | Wu et al. | |
| 2017/0295675 A1* | 10/2017 | Huang | H05K 7/20754 |
| 2018/0220551 A1* | 8/2018 | Elkins | H05K 7/20145 |
| 2020/0329585 A1 | 10/2020 | Fuller et al. | |

FOREIGN PATENT DOCUMENTS

| | | |
|---|---|---|
| DE | 102008050376 | 4/2011 |
| DE | 102008050376 B4 | 4/2011 |
| EP | 2991466 | 8/2017 |
| EP | 2991466 B1 | 8/2017 |

* cited by examiner

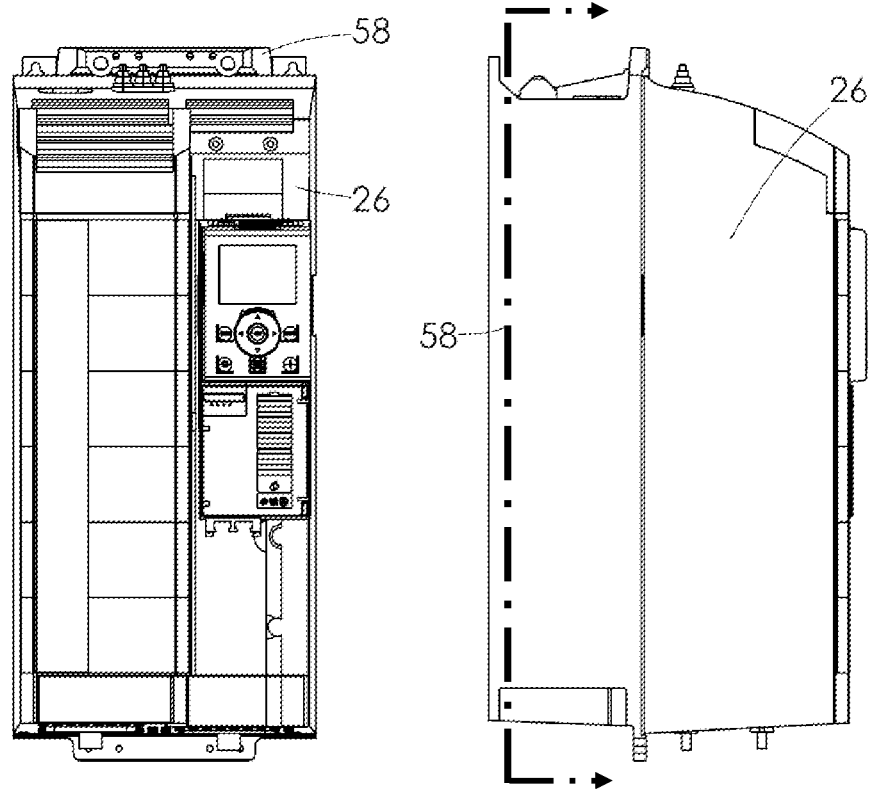
FIG. 4
FIG. 5
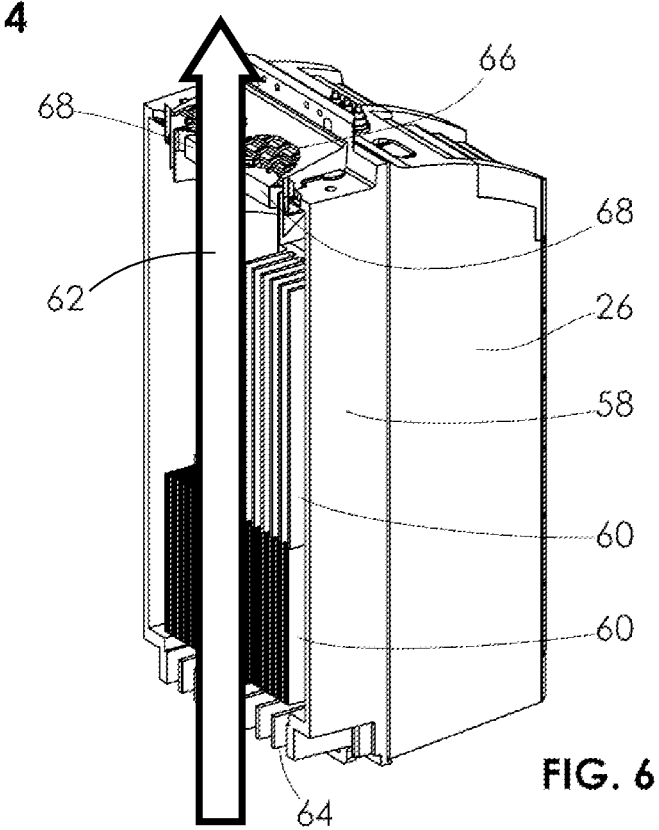
FIG. 6

ELECTRICAL CONTROL PANEL WITH COOLING SYSTEM

BACKGROUND

Field of the Invention

The present invention generally relates to industrial electrical control panels, and more particularly to electrical control panels with a cooling system.

Description of the Related Art

Industrial electrical control panels include an enclosure box that contains multiple electrical components. Often during operation one of these electrical components (referred to as the primary electrical component) generates a high amount of heat, relative to the other (secondary) electrical components. This heat must be transferred away from the primary electrical component and out of the enclosure box to prevent an excessive temperature increase that could damage the primary electrical component, as well as the other electrical components and mechanical components also located inside the enclosure box.

It is common for the primary electrical component to include a first heat exchanger, integrated with or dedicated to the primary component, designed to transfer the heat generated by the primary component to the surrounding air within the enclosure, either by natural convection or by forced air. This creates a stream of hot air exiting the first heat exchanger. But since the primary electrical component is located inside the enclosure box, this configuration does not meet the need to transfer heat away from the other electrical components, described above, because the heat is still trapped inside the enclosure box. So, it is necessary to have a means to transfer the heat from the air inside the enclosure box away from the control panel.

In some situations, the electrical control panel is located in a friendly environment such that the local ambient air in the area where the electrical control panel is installed, also referred to herein as the environmental air, can be circulated, either by natural convection or by one or more fans, through the enclosure box via vents in the box, thus accomplishing the needed heat transfer. But there are many situations where the electrical control panel is not located in such a friendly environment, such as when explosive vapors may be present, or where dust, dirt or moisture may be present. In these situations, circulation of the environmental or local ambient air through the enclosure box is not acceptable and can be dangerous or detrimental to the electrical components. Instead, the enclosure box must be isolated from the local ambient air and a more complex heat transfer method is needed.

In such situations where the electrical control panel must be sealed, one of the most common heat transfer methods used includes using convection and/or conduction to transfer the heat from the electrical components to the outer surfaces of the enclosure box, where convection transfers the heat to the environmental or local ambient air. Finned surfaces and/or fans sometimes may be used to increase surface area and convection effectiveness.

Another common heat transfer method used when the electrical control panel must be sealed includes using a second heat exchanger (separate from the first heat exchanger integrated with or dedicated to the primary electrical component), which is attached to the enclosure box. The second heat exchanger typically is of a design such that it and the enclosure box together form a sealed compartment such that air cannot enter or exit. It also may include a fan that forces the hot air within the enclosure box to circulate through the second heat exchanger. The second heat exchanger may further include a heat transfer element that the circulating hot air passes across or through and which causes heat in the circulating air to be transferred to the environmental or local ambient air (either directly or through a refrigerant fluid system), thus reducing the temperature of the circulated air inside the sealed compartment.

Unfortunately, the two methods described above to transfer heat from an enclosure box isolated from the local ambient air have a significant problem. They both allow the hot air generated by the primary electrical component to circulate throughout the enclosure box, creating a hot environment for the other electrical components. This hot environment reduces the reliability of the other electrical components and may substantially limit the selection of available electrical and/or mechanical components to only those rated for higher temperatures, which is likely to increase cost and complexity. Similarly, the hot environment within the enclosure box may reduce the rated temperature of the location in which the industrial electrical control panel can be installed, which may limit marketability of the electrical control panel.

SUMMARY

The example embodiments shown and described herein provide a beneficial and economical industrial electrical control panel that overcomes disadvantages in the prior art. The present disclosure provides an industrial electrical control panel having an enclosure box and a primary electrical component that generates heat while operating. The primary electrical component includes a first heat exchanger, integrated with or dedicated to the primary electrical component, designed to transfer the heat generated by the primary electrical component to the surrounding air, either by natural convection or by forced air. The disclosure further includes one or more secondary or other electrical components that generate less heat than the primary electrical component, a second heat exchanger attached to the enclosure box that cools air and forces air to flow through the enclosure box, and one or more air diverter elements that direct a substantial portion of the heated air exiting the first heat exchanger into the inlet of the second heat exchanger without the heated air contacting or flowing over at least one of the secondary electrical components.

The disclosed structure provides advantages in that a substantial portion or nearly all of the heated air exiting the first heat exchanger that is associated with the higher heat generating primary electrical component enters the second heat exchanger before it can circulate through other areas of the enclosure box and heat-up the secondary electrical components or other mechanical control panel components, which may be heat-sensitive. By reducing the enclosure box temperature, the cooling system provided improves the reliability of the electrical and mechanical components, lowers the required temperature rating of electrical components and enables operation in higher temperature environments, while also avoiding issues with unfriendly environmental or local ambient air that may contain explosive vapors, dust, dirt, moisture or other contaminants. These advantages, in turn, may permit use of more cost-effective components, reduced maintenance and lower risk of downtime due to failed components.

In a first aspect, the disclosure provides an electrical control panel including an enclosure box having an outer body with an inlet opening and an outlet opening, wherein the outer body is sealed such that air can only enter or exit through the inlet and outlet openings in the outer body. The electrical control panel further includes a primary electrical component mounted inside the enclosure box and having a first heat exchanger that transfers heat generated by the primary electrical component to air surrounding the primary electrical component and first heat exchanger. Also included in the electrical control panel is one or more secondary electrical components mounted inside the enclosure box with each secondary electrical component generating less heat when operating than the heat generated by the primary electrical component when operating. A second heat exchanger is attached to the enclosure box and has an internal air passageway that includes an inlet opening and an outlet opening, wherein the inlet opening of the internal air passageway of the second heat exchanger is in fluid communication with the outlet opening of the enclosure box such that air can pass from the enclosure box into the internal air passageway of the second heat exchanger. The outlet opening of the internal air passageway of the second heat exchanger is in fluid communication with the inlet opening of the enclosure box such that air can pass from the internal air passageway of the second heat exchanger into the enclosure box, wherein the internal air passageway of the second heat exchanger is sealed such that air can only enter or exit through the inlet and outlet openings of the internal air passageway of the second heat exchanger, wherein the second heat exchanger further comprises a heat transfer element and at least one fan that circulates air through the internal air passageway of the second heat exchanger and across or through the heat transfer element thereby reducing the temperature of the air circulated through the internal air passageway of the second heat exchanger, and wherein the enclosure box outer body and the internal air passageway of the second heat exchanger together define a sealed compartment relative to ambient air around the outside of the enclosure box and internal air passageway of the second heat exchanger. The electrical control panel also includes one or more air diverter elements that direct a majority of the heated air exiting the outlet of the first heat exchanger to enter the inlet opening of the internal air passageway of the second heat exchanger and to avoid contacting at least one of the secondary electrical components, and wherein said at least one secondary component is contacted by air exiting the outlet opening of the internal air passageway of the second heat exchanger.

In a second aspect, the disclosure provides an electrical control panel including an enclosure box having an outer body having an inlet opening and an outlet opening, wherein the outer body is sealed such that air can only enter or exit through the inlet and outlet openings in the outer body, a plurality of electrical components are mounted within the enclosure box, with the plurality of electrical components including a primary electrical component having a first heat exchanger having an inlet and an outlet. A separate second heat exchanger has an internal air passageway being connected to and in fluid communication with the enclosure box which defines a sealed compartment therewith, and the internal air passageway of the second heat exchanger having an inlet and an outlet, wherein the second heat exchanger cools air received in the inlet of the internal air passageway from the outlet of the first heat exchanger and from air otherwise passing through the enclosure box and forces the cooled air to exit the outlet of the internal air passageway of the second heat exchanger and to enter the inlet of the outer body of the enclosure box and flow within the enclosure box with some of the cooled air passing through the first heat exchanger. The electrical control panel further includes one or more air diverter elements mounted within the enclosure box that direct a majority of the heated air exiting the outlet of the first heat exchanger to enter the inlet of the internal air passageway of the second heat exchanger without flowing over at least one of the other of the plurality of electrical components, and wherein said at least one secondary component is contacted by air exiting the outlet opening of the internal air passageway of the second heat exchanger.

In a third aspect, the disclosure provides an electrical control panel including an enclosure box having an outer body having an inlet opening and an outlet opening, wherein the outer body is sealed such that air can only enter or exit through the inlet and outlet openings in the outer body. The electrical control panel further includes a primary electrical component mounted inside the enclosure box and having a first heat exchanger having a heat transfer element and at least one fan that transfers heat generated by the primary electrical component to air surrounding the primary electrical component and the first heat exchanger. Also included in the electrical control panel is one or more secondary electrical components mounted inside the enclosure box with each secondary electrical component generating less heat when operating than the heat generated by the primary electrical component when operating. A second heat exchanger is attached to the enclosure box and has an internal aft passageway that includes an inlet opening and an outlet opening, wherein the inlet opening of the internal air passageway of the second heat exchanger is in fluid communication with the outlet opening of the enclosure box such that air can pass from the enclosure box into the internal air passageway of the second heat exchanger. The outlet opening of the internal air passageway of the second heat exchanger is in fluid communication with the inlet opening of the enclosure box such that air can pass from the internal air passageway of the second heat exchanger into the enclosure box, wherein the internal air passageway of the second heat exchanger is sealed such that air can only enter or exit through the inlet and outlet openings of the internal air passageway of the second heat exchanger. The second heat exchanger further comprises a heat transfer element and at least one fan that circulates air through the internal air passageway of the second heat exchanger and across or through the heat transfer element thereby reducing the temperature of the air circulated through the internal air passageway of the second heat exchanger, wherein the enclosure box outer body and the internal air passageway of the second heat exchanger together define a sealed compartment relative to the ambient air around the outside of the enclosure box and internal air passageway of the second heat exchanger, wherein the at least one fan of the first heat exchanger provides less air flow than the at least one fan that circulates air through the internal air passageway of the second heat exchanger, and one or more air diverter elements direct heated air exiting the outlet of the first heat exchanger to enter the inlet opening of the internal air passageway of the second heat exchanger.

It will be appreciated that the sealed compartment defined by the enclosure box and internal air passageway of the second heat exchanger of this disclosure is to be understood as having an ingress prevention design. Thus, the sealed compartment is defined as being sealed relative to avoiding ingesting environmental or ambient air surrounding the enclosure box and second heat exchanger of the electrical control panel when prepared for and/or during operation of the electrical control panel. Thus, the electrical control panel and or internal air passageway of the second heat exchanger optionally may include an air purge or pressurization system that includes a source of pressurized clean air and a one-way relief valve and that is connected to and in fluid communication with the sealed compartment. Such an air purge or pressurization system optionally may be used in at least three ways. First, it may be used to subject the sealed compartment to a sustained, low positive pressure to ensure that no explosive vapors or contaminated environmental or ambient air may be drawn into the sealed compartment. Second, it may be used after servicing the electrical control panel if the enclosure box has been opened or separated from the second heat exchanger, so that upon resealing the sealed compartment any air that may have been captured therein may be purged and replaced with clean air before restarting operation of the electrical control panel. Third, it may be used to periodically purge or flush the air from the sealed compartment and replace it with clean air, so as to ensure that a new volume of clean air is will be present within the sealed compartment.

It is to be understood that both the foregoing general description and the following detailed description are exemplary and provided for the purpose of explanation only and are not restrictive of the subject matter claimed. Further features and objects of the present disclosure will become more fully apparent in the following description of the preferred embodiments and from the appended claims.

BRIEF DESCRIPTION OF THE DRAWINGS

In describing the preferred embodiments, references are made to the accompanying drawing figures wherein like parts have like reference numerals, and wherein:

FIG. 4 is a front view of the primary electrical component and first heat exchanger of the electrical control panel shown in FIG. 1.

FIG. 5 is a side view of the primary electrical component and first heat exchanger of the electrical control panel shown in FIG. 1 with a section line for FIG. 6.

FIG. 6 is a perspective sectioned view of the primary electrical component and first heat exchanger shown in FIGS. 3-5 of the electrical control panel shown in FIG. 1, sectioned through the section line shown in FIG. 5.

It should be understood that the drawings are not to scale. While some mechanical details of the example electrical control panels, including wiring, details of fastening means and other plan and section views of the particular components, may not have been shown, such details are considered to be within the comprehension of those skilled in the art in light of the present disclosure. It also should be understood that the present disclosure and claims are not limited to the preferred embodiment illustrated.

DETAILED DESCRIPTION

Referring generally to FIGS. 1-10, it will be appreciated that the electrical control panels of the present disclosure generally may be embodied within numerous configurations. The disclosure provides an electrical control panel with a cooling system that provides improved cooling relative to the prior art.

Figure 1:
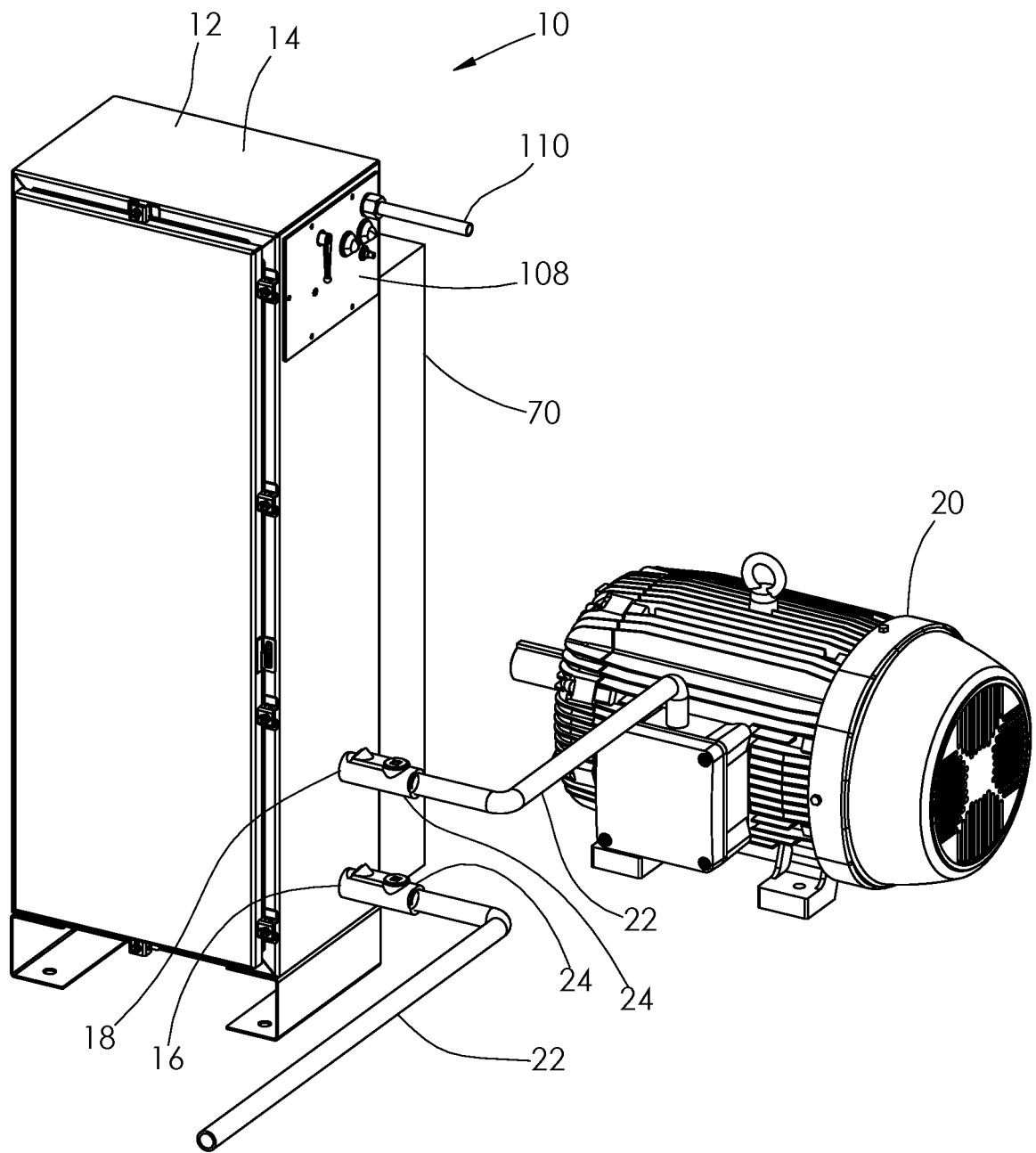
FIG. 1 is a perspective view of an example electrical control panel connected to a second heat exchanger, along with a motor being controlled by the control panel and associated conduit hardware.

FIG. 1 shows an example preferred embodiment of an electrical control panel 10, which includes an enclosure box 12 having an ingress protection or sealed design with respect to preventing vapors, dust, moisture or other contaminants from entering the enclosure box. Such ingress protection designs are well known in the art and typically comply with one or more international standards such as NEMA 4X or IEC 60529 IP54. Thus, the example enclosure box 12 includes seals and closure means suitable to be NEMA or UL rated with respect to being sealed from outside vapors, dust, moisture and/or other contaminants. The ingress protection design may further include an air purge or pressurization system, as will be described further herein.

Enclosure box 12 includes an outer body 14 with one or more electrical openings for wires. In this embodiment there are two openings, a first opening 16 is for wires (not shown) that connect to an incoming power source (not shown) and a second opening 18 is for wires (not shown) that connect to an electric motor 20 that is exterior to the enclosure box 12, such as a 75 hp electric motor. Connected to openings 16, 18 are conduit pipes 22 and conduit connectors 24 having an ingress protection design to prevent vapors, dust, moisture or other contaminants from entering enclosure box 12.

Figure 3:
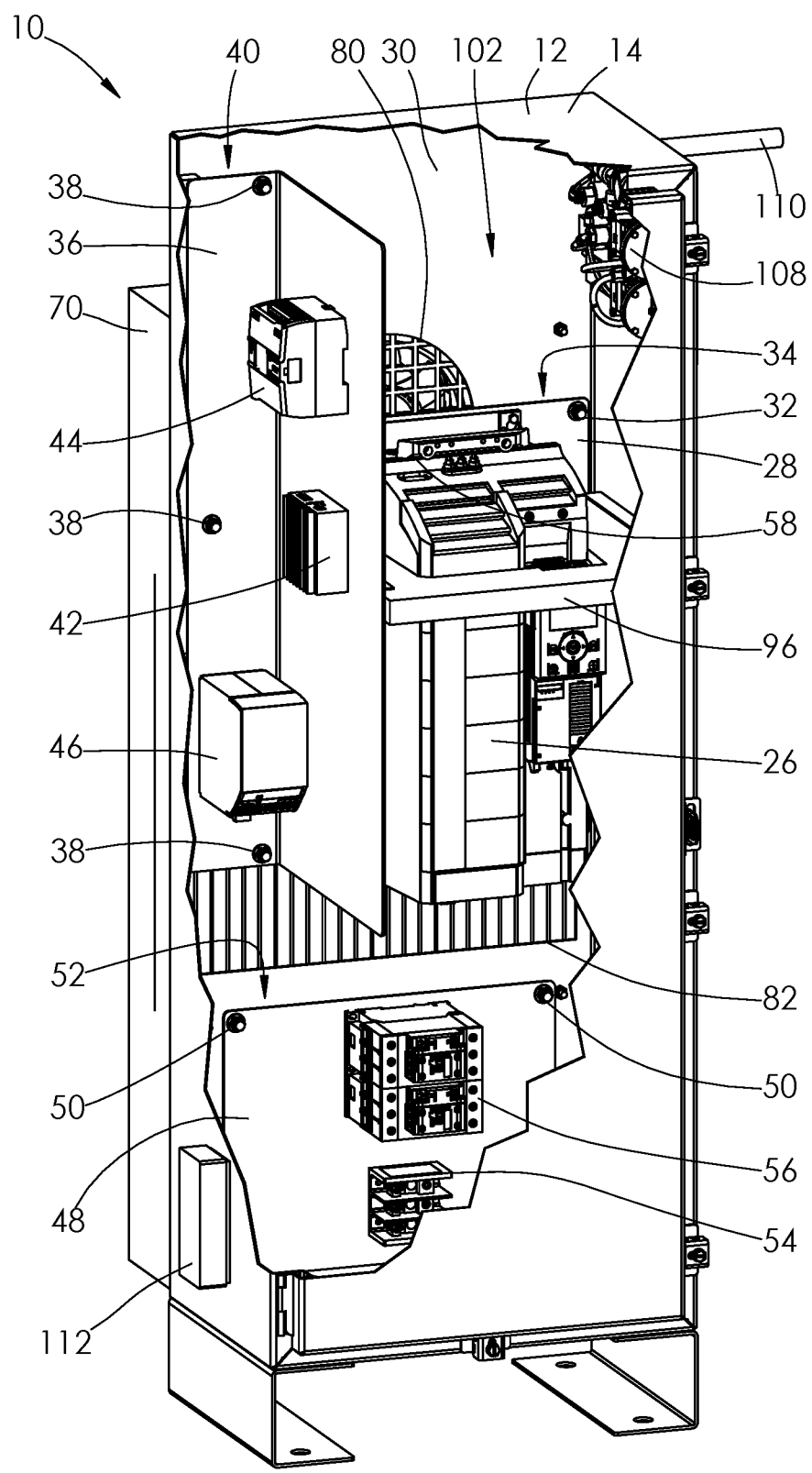
FIG. 3 is a perspective view of the electrical control panel shown in FIG. 1 with a portion of the enclosure box cut away to reveal a view inside the enclosure box.

As shown in FIG. 3, electrical control panel 10 also includes a primary electrical component 26. In this embodiment, primary electrical component 26 is an adjustable speed drive (ASD) for electric motor 20. Primary electrical component 26 is mounted to a drive subpanel 28 which in turn is mounted to a back wall 30 of enclosure box 12 on standoff bolts 32 that create a gap 34 between back wall 30 and drive subpanel 28. Primary electrical component 26 generates a high amount of heat W in watts when operating. In this embodiment, primary electrical component 26 is in the form of the ASD and generates about 1305 watts of heat W, on average, when operating. This level of heat W is considered herein to be a "high amount of heat" relative to a volume V of enclosure box 12 in cubic meters, with a ratio of at least 1500 watts per cubic meter. In this example, enclosure box 12 has dimensions of about 46×30×122 cm and an internal volume of about 0.17 cubic meters, so with 1305 watts of heat, the ratio of heat in watts to cubic meters is 7676 to 1. One can easily envision many other embodiments with other primary electrical components that generate a high amount of heat and with enclosure boxes having other sizes.

Electrical control panel 10 further includes a logic subpanel 36 that is L-shaped and includes a first portion that extends parallel to back wall 30 of enclosure box 12 and a second portion that extends perpendicularly to back wall 30. Logic subpanel 36 is mounted to back wall 30 of enclosure box 12 on standoff bolts 38 that create a gap 40 between back wall 30 and the first portion of logic subpanel 36. Mounted to logic subpanel 36 are one or more other or secondary electrical components, which in this example include a computer 42, a programmable logic controller (known as a PLC) 44 and a power transformer 46. Secondary electrical components 42, 44, 46 each generate heat when operating, but the amounts of heat are lower than the heat generated by the primary electrical component 26. In this embodiment, control panel 10 also includes a power subpanel 48 that is mounted to back wall 30 of enclosure box 12 on standoff bolts 50 that create a gap 52 between back wall 30 and power subpanel 48. Mounted to power subpanel 48 are additional secondary electrical components, which in this example include a terminal block 54 and a contactor block 56.

Power transformer 46 is wired (not shown) to terminal block 54, which in turn is wired (not shown) to the incoming power source (not shown), and transforms the incoming power into a compatible power source for computer 42 and PLC 44. Primary electrical component (ASD) 26 also is wired (not shown) to the incoming power source (not shown) through terminal block 54 and to motor 20 through contactor block 56. Computer 42 runs a program to determine a desired speed for motor 20, communicates that desired speed to PLC 44, and PLC 44 in turn communicates that desired speed to ASD 26. Using hardware and methods well known in the art, ASD 26 transforms the incoming power and supplies it to motor 20, causing motor 20 to run at the desired speed.

As shown in FIGS. 4-6, primary electrical component 26 includes a first heat exchanger 58 that transfers the generated heat of primary electrical component 26 to surrounding air. In this example, first heat exchanger 58 is integrated with primary electrical component 26, but other configurations are contemplated wherein first heat exchanger 58 is a separate unit but dedicated to primary electrical component 26. The example first heat exchanger 58 includes high surface area fins 60 designed to conduct heat from primary electrical component 26 and transfer that heat to air surrounding the primary electrical component 26 and first heat exchanger 58. First heat exchanger 58 further includes an air passageway 62 having an inlet opening 64, an outlet opening 66 and at least one fan 68 that forces air to flow through passageway 62, entering through inlet opening 64 and exiting through outlet opening 66. Fins 60 are located inside passageway 62, so the heat generated by primary electrical component 26 is transferred through fins 60 to the air flowing through passageway 62, and as such, the air exiting outlet opening 66 has been heated to a higher temperature than the air entering inlet opening 64.

Figure 2:
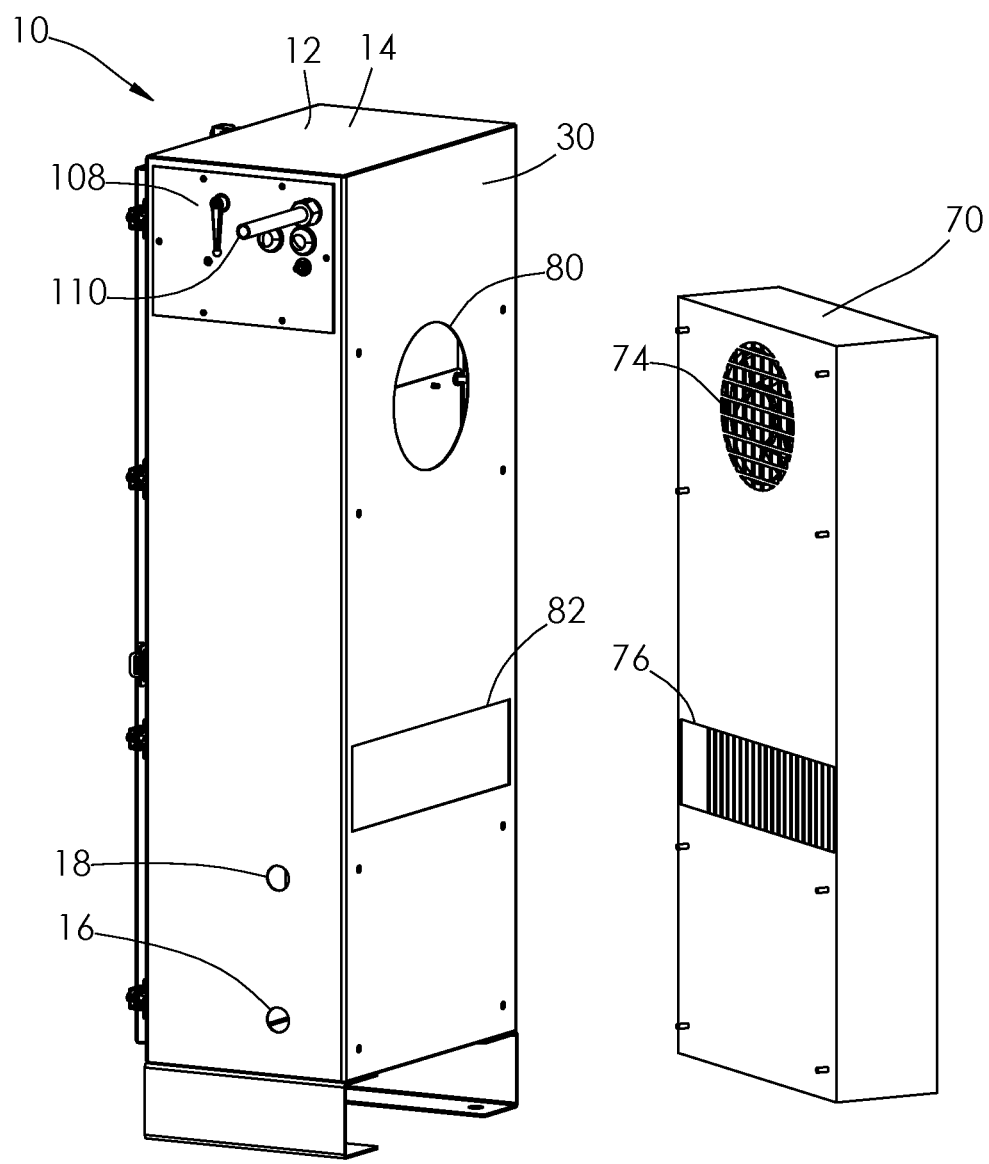
FIG. 2 is a perspective view of the example shown in FIG. 1 with the second heat exchanger separated from the electrical control panel.
Figure 7:
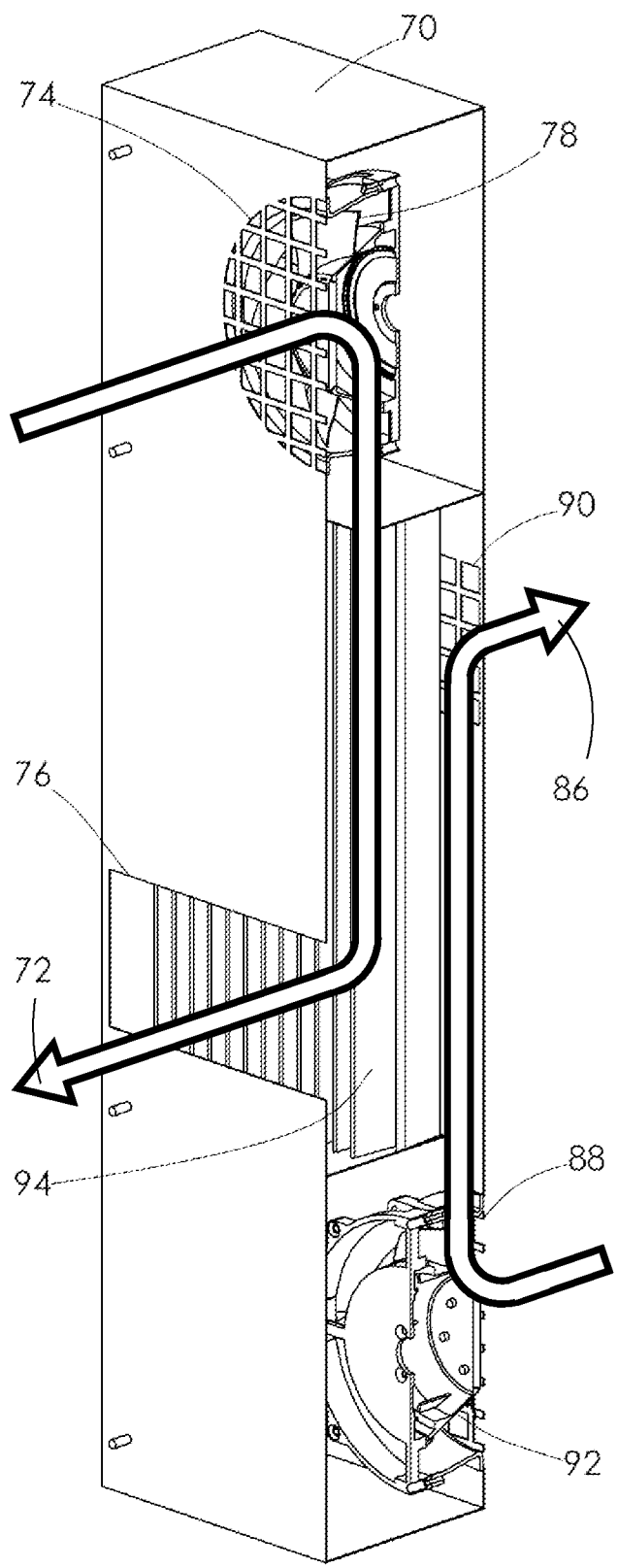
FIG. 7 is a perspective sectioned view of the second heat exchanger of the electrical control panel shown in FIGS. 1-3, sectioned mid-plane.
Figure 10:
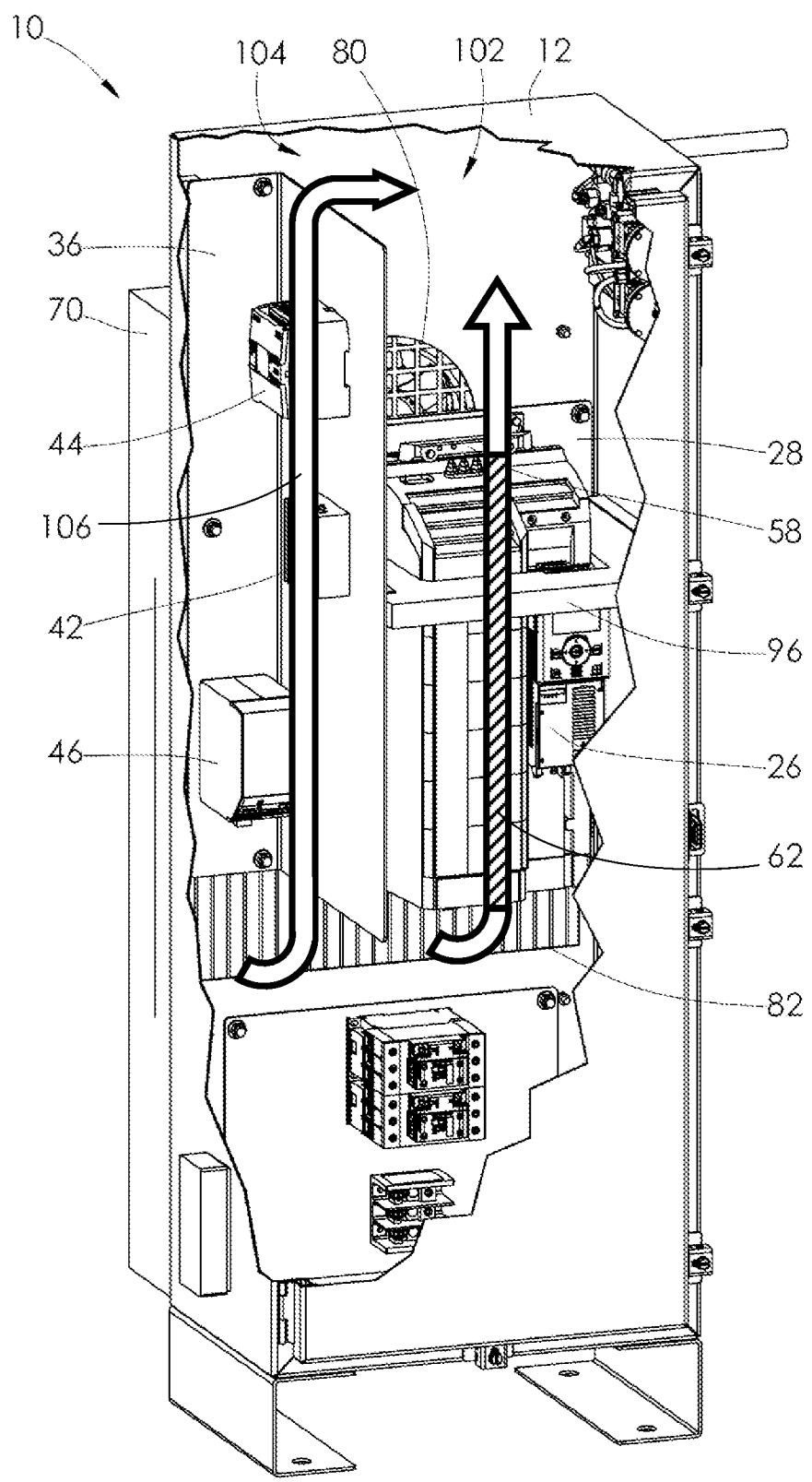
FIG. 10 is a perspective view of the electrical control panel shown in FIGS. 1-3 with a portion of the enclosure box shown in FIGS. 1-3 and 8-9 cut away to reveal a view inside the enclosure box.
Figure 11:
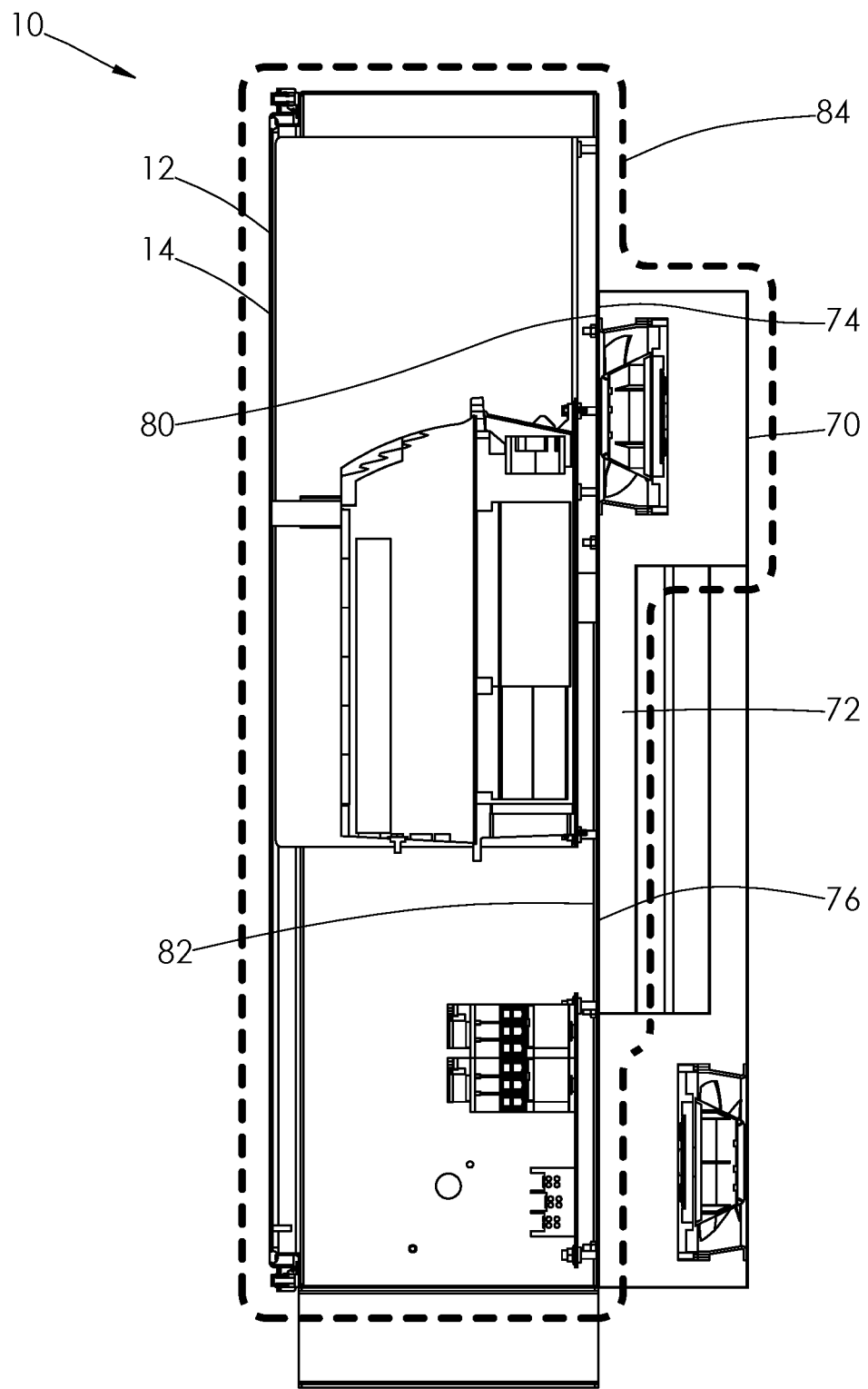
FIG. 11 is a diagram showing the sealed compartment of the example electrical control panel shown in FIG. 1, defined by the enclosure box and the internal air passageway of the second heat exchanger.

Electrical control panel 10 further includes a second heat exchanger 70, shown sectioned mid-plane in FIG. 7. As shown in FIGS. 1, 3 and 10, second heat exchanger 70 is attached to enclosure box 12. It is contemplated that second heat exchanger 70 can be of many different configurations commonly known in heat exchanger art. In this example, second heat exchanger 70 includes an internal air passageway 72 having an inlet opening 74, an outlet opening 76 and at least one fan 78 that force air to flow through internal air passageway 72, entering through inlet opening 74 and exiting through outlet opening 76. As seen in FIG. 2, inlet opening 74 of second heat exchanger 70 is in fluid communication with an outlet opening 80 of enclosure box 12 and outlet opening 76 of internal air passageway 72 of second heat exchanger 70 is in fluid communication with an inlet opening 82 of enclosure box 12, such that the air flowing through internal air passageway 72 of second heat exchanger 70 also flows through enclosure box 12. In accordance with the diagram in FIG. 11, it will be appreciated that the connection between enclosure box 12 and internal air passageway 72 of second heat exchanger 70 is sealed such that outer body 14 of enclosure box 12 and internal air passageway 72 together form a sealed compartment 84 to complete the ingress protection design for electrical control panel 10 to prevent air from entering or exiting. It will be appreciated that the sealed compartment 84 defined by the enclosure box 12 and internal air passageway 72 of the second heat exchanger 70 of the electrical control panel 10 of this disclosure is defined as being sealed relative to avoiding ingress or ingesting of environmental or ambient air that surrounds the enclosure box 12 and second heat exchanger 70 of the electrical control panel 10 during operation of the electrical control panel 10. As explained further herein, the electrical control panel 10 may include an air purge or pressurization system, which would be consistent with ingress protection.

Second heat exchanger 70 further includes an external air passageway 86 having an inlet opening 88, an outlet opening 90 and at least one fan 92 that forces air to flow through the external air passageway 86. The external air passageway 86 of second heat exchanger 70 communicates with environmental or ambient air outside of enclosure box 12, with the at least one 92 pulling outside ambient air into inlet opening 88, pushing that outside air through the external air passageway 86 and having the heated air exit through outlet opening 90.

Also seen in FIG. 7, second heat exchanger 70 includes a heat transfer element 94 in the form of a thin, high-surface-area sealed barrier between internal air passageway 72 and external air passageway 86 that efficiently allows heat to transfer from internal air passageway 72 containing hotter air to the external air passageway 86 containing cooler air, while also preventing environmental air or contaminants from crossing the barrier provided by the heat transfer element 94. It is contemplated that other configurations for second heat exchanger 70 are possible, for example, some configurations may include a refrigerant circuit as part of the heat transfer element between internal air passageway 72 and the external air passageway 86 to enable greater heat transfer.

During normal operation, the temperature of the air in internal air passageway 72 is greater than the temperature of the outside air, and thus also the air in the external air passageway 86, so heat is transferred from internal air passageway 72 to the external air passageway 86 and thereby to the outside environmental or ambient air. In this heat transfer process, within sealed compartment 84, the temperature of the air in internal air passageway 72 of second heat exchanger 70 is lowered such that the temperature of the air exiting internal air passageway 72 and entering enclosure box 12 is lower than the temperature of the air entering internal air passageway 72 from enclosure box 12.

Figure 8:
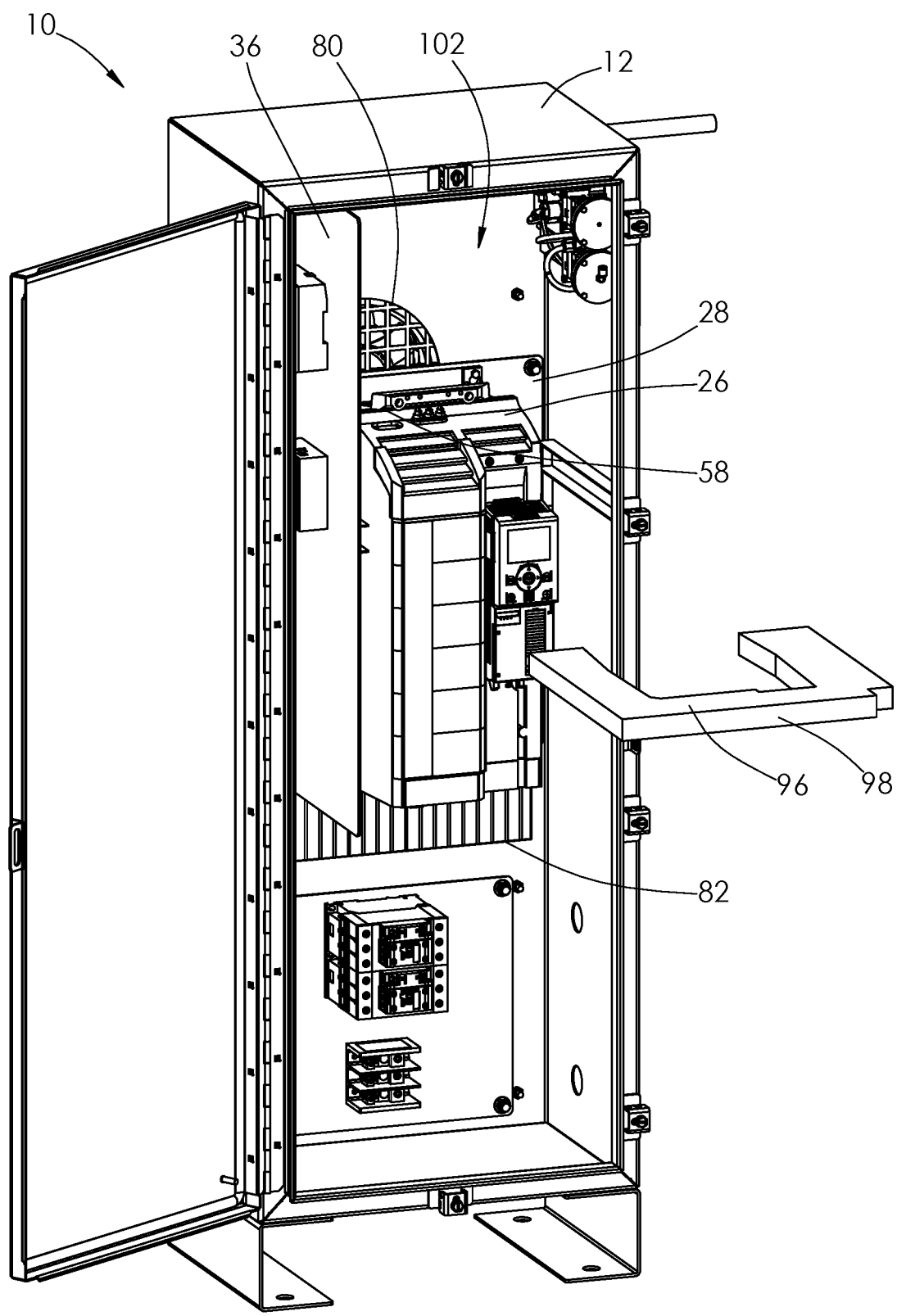
FIG. 8 is a perspective partially exploded view of the enclosure box of the electrical control panel shown in FIGS. 1-3 with the enclosure box door opened and an air panel separated from the enclosure box.
Figure 9:
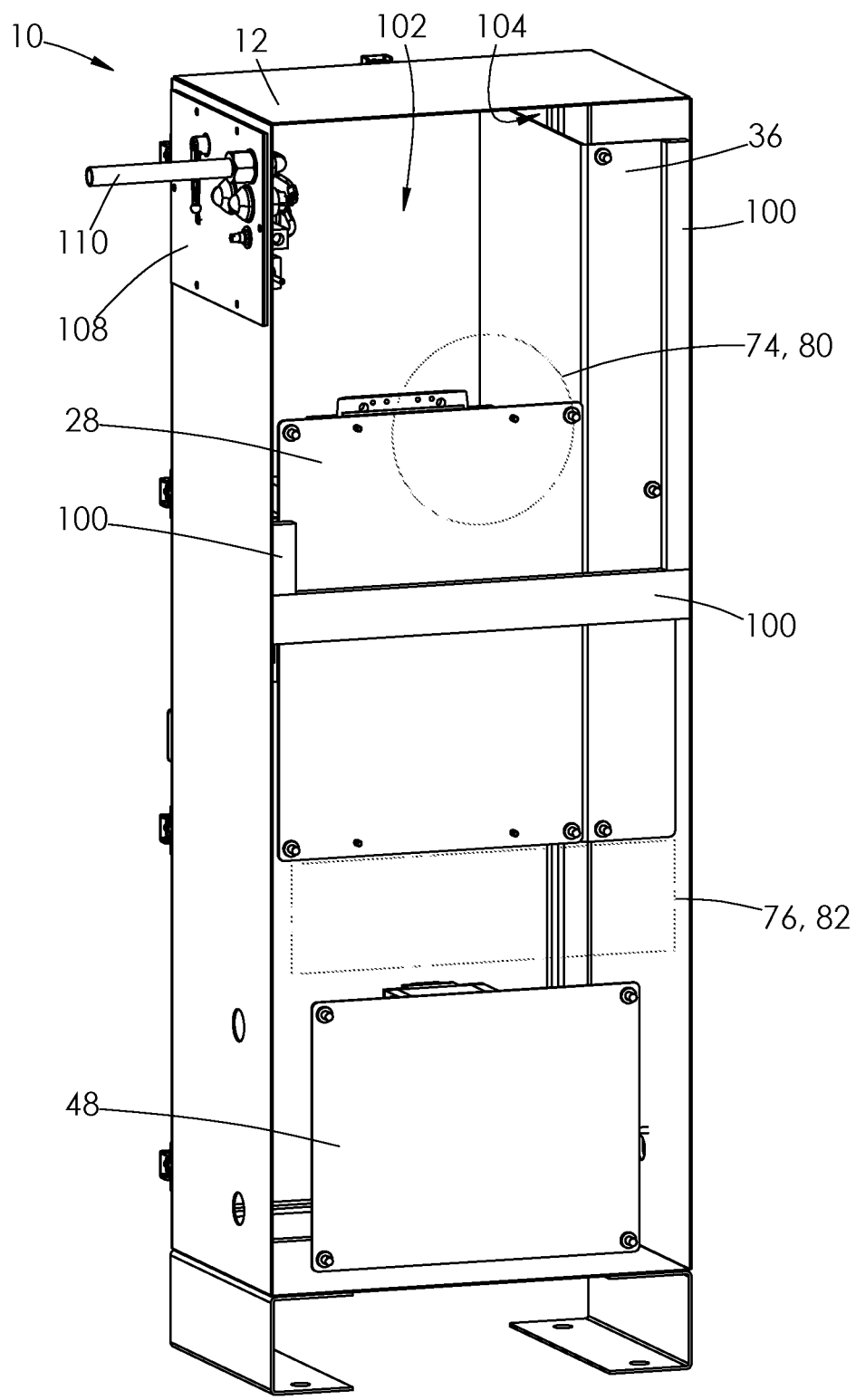
FIG. 9 is a perspective view of the enclosure box of the electrical control panel shown in FIG. 1 with the back wall of the enclosure box omitted to reveal a view inside the enclosure box.

Referring to FIGS. 8-10, within enclosure box 12 are one or more air diverter elements that together direct at least a majority, and ideally as much as possible, of the heated air exiting outlet opening 66 of first heat exchanger 58 to enter inlet opening 74 of second heat exchanger 70 without the heated air contacting or flowing over at least one of secondary electrical components 42, 44, 46, 54, 56. Thus, at least one and preferably all of the secondary electrical components will avoid being contacted by the heated air exiting the first heat exchanger 58 before it enters the second heat exchanger 70, but the at least one secondary component will be contacted by air exiting the outlet opening 76 of the internal air passageway 72 of the second heat exchanger 70. The relative amount of the heated air exiting the first heat exchanger 58 that is directed to enter inlet opening 74 of the second heat exchanger 70 will depend upon placement of one or more air diverter elements, such as example air diverter elements 28, 36, 96, 100, or other such air diverter elements, placement of the secondary electrical components within the enclosure box, as well as the relative heated air output of first heat exchanger 58 by natural convection and/or the at least one 68 that forces air to flow through passageway 62, versus the air drawn into the second heat exchanger 78 by the at least one fan 78 that forces air to flow through internal air passageway 72. Accordingly, selections within these factors permit tuning of the percentage or extent to which the heated air exiting the first heat exchanger 58 avoids contacting secondary electrical components before entering the second heat exchanger 70. For example, without necessarily sealing all gaps with air diverter elements, if the forced air flow capacity through the second heat exchanger 70 is greater than the flow capacity through the first heat exchanger 58, not only a majority but likely 90% or more of the heated air exiting the first heat exchanger 58 will enter the second heat exchanger 70 without contacting at least one of the secondary electrical components. As such, it will be appreciated that this can be affected by the selected capacity of fans 68, 78 and placement of air diverter elements. Thus, directing a majority of the heated air from first heat exchanger 58 means providing a flow path that is diverted in a manner that a majority of the heated air from the first heat exchanger 58 bypasses secondary electrical components 42, 44, 46, 54, 56 as that heated air is in route to outlet opening 80 of enclosure box 12 which is in fluid communication with inlet opening 74 of internal air passageway 72 of second heat exchanger 70.

In this example, drive subpanel 28 and logic subpanel 36 are air diverter elements that have dual roles; they are mounting structures for secondary electrical components as previously described, as well as air diverter elements. Within enclosure box 12 is another air diverter element in the form of an air panel 96 having an outer perimeter 98 shaped to closely match the contours of primary electrical component 26, drive subpanel 28, logic subpanel 36 and enclosure box 12, such that very little or no air can flow around outer perimeter 98 of air panel 96. Also within enclosure box 12 are additional air diverter elements in the form of blocks 100, which are positioned in gaps between drive subpanel 28, logic subpanel 36 and enclosure box 12, such that very little or no air can flow through gaps 34, 40 between back wall 30 of enclosure box 12 and each of drive subpanel 28 and logic subpanel 36. Air panel 96 and blocks 100 are preferably constructed of flexible, closed-cell rubber foam, but they also may be made of plastic, metal or any other material which substantially prevents air from passing through or around the air diverter elements. It also will be appreciated that any of the air diverter elements may include seals or other components useful in blocking air flow. It further will be appreciated that air diverter elements optionally may be arranged in configurations to also provide one or more additional flow paths with respect to cooling or heated air, such as to prioritize flow over particular secondary electrical components within the electrical control panel 10.

In an upper area of enclosure box 12, a hot air chamber 102 is bounded and defined by air diverter elements 28, 36, 96, 100. Hot air chamber 102 has three openings for air to enter or exit. The first opening is outlet opening 66 of first heat exchanger 58, where heated air exits air passageway 62 of first heat exchanger 58, pushed by the at least one fan 68 of first heat exchanger 58. The second opening is outlet opening 80 of enclosure box 12, which is in fluid communication with inlet opening 74 of internal air passageway 72 of second heat exchanger 70, where air enters internal air passageway 72 of second heat exchanger 70, pulled by the at least one fan 78 of second heat exchanger 70. The third opening is a gap 104 between the second portion of logic subpanel 36 that extends perpendicularly to back wall 30 of enclosure box 12 and a side wall of enclosure box 12. In this example, the rated flowrate of the at least one fan 78 of second heat exchanger 70, and therefore of internal air passageway 72 of second heat exchanger 70, is higher than the rated flowrate of the at least one fan 68 of first heat exchanger 58, and therefore of passageway 62 of first heat exchanger 58. Accordingly, a majority and likely 90% or more of the heated air exiting outlet opening 66 of first heat exchanger 58 is pulled into inlet opening 74 of internal air passageway 72 of second heat exchanger 70, without the heated air contacting or flowing over at least one or indeed any of the secondary electrical components 42, 44, 46, 54, 56. Additional air also is pulled through gap 104 to balance the flowrates of fans 78 and 68. Thus, as previously noted, a substantial portion of the heated air from first heat exchanger 58 is directed so as to have a flow path that is diverted in a manner that bypasses the secondary electrical components 42, 44, 46, 54, 56 in route to outlet opening 80 of enclosure box 12 which is in fluid communication with inlet opening 74 of internal air passageway 72 of second heat exchanger 70.

Toward the bottom of enclosure box 12 cooled air exits passageway 72 of second heat exchanger 70 through exit opening 76 of second heat exchanger 70 and enters enclosure box 12 through inlet opening 82 of enclosure box 12. Because outer body 14 of enclosure box 12 and passageway 72 of second heat exchanger 70 together form sealed compartment 84 in FIG. 11, this cooled air must flow through enclosure box 12 and hot air chamber 102 and return to passageway 72 of second heat exchanger 70 through exit opening 80 of enclosure box 12 and inlet opening 74 of second heat exchanger 70. In this example there are only two paths for this air to flow. The first path is through passageway 62 of first heat exchanger 58, entering inlet opening 64 of first heat exchanger 58 and exiting outlet opening 66 of first heat exchanger 58. The second path is through a secondary passageway 106 bounded by logic subpanel 36, enclosure box 12 and blocks 100. Airflow through secondary passageway 106 is induced by the imbalanced flowrates of fans 78 and 68 as previously described, and this airflow passes over and around computer 42, PLC 44 and power transformer 46, thus providing cooling for these three secondary electrical components.

The ratio of airflow between the first and second paths is determined by the rated flowrates of fans 78 and 68, as well as the size of gap 104. The size of gap 104 may be selectively designed to be of various sizes to provide various ratios of airflow between the first and second paths, as desired or necessary to provide improved cooling performance. Additionally, it is contemplated that logic subpanel 36 may be mounted to control box 12 via an adjustable mechanism or choice among different length standoff bolts to permit selective movement of logic subpanel 36 to change the size of gap 104 and provide adjustability of the gap size, which may include, for example, a plate mounted with slotted holes, or a hinged plate or other suitable simple mechanisms.

As noted above and as shown in FIG. 11, it will be appreciated that the sealed compartment 84 defined by the enclosure box 12 and internal air passageway 72 of the second heat exchanger 70 is defined as or understood to be sealed relative to avoiding ingress or ingesting environmental or ambient air surrounding the enclosure box 12 and second heat exchanger 70 of the electrical control panel 10 when prepared for and/and or during operation of the electrical control panel 10. Thus, the enclosure box 12 and/or internal air passageway 72 of the second heat exchanger 70 of the electrical control panel 10 may include an air purge or pressurization system 108 that is connected to and in fluid communication with the sealed compartment 84. Air purge or pressurization systems are known in the prior art, and therefore, the details of such a system need not be elaborated upon here. It will be appreciated that the example air purge or pressurization system 108 includes an inlet line or conduit pipe 110 and a one-way relief valve 112, which have an ingress protection design, but typically are installed in spaced apart locations. In this example, inlet conduit pipe 110 and the controls of the system 108 are connected to a source of pressurized clean air that may be supplied to the sealed compartment 84 in a constant manner, on demand, or periodically. As may be seen in FIGS. 1-3 and 9, inlet conduit pipe 10 and the controls of air purge system 108 are installed in an upper corner of the enclosure box 12. Also, as may be seen in FIG. 3, one-way relief valve 112 of air purge system 108 is installed in a lower portion of an opposite side wall of enclosure box 12 to permit excess air in the sealed compartment 84 to be expelled or exhausted upon achieving a selected pressure within the sealed compartment 84. It will be appreciated that the respective locations of inlet conduit pipe 110 and one-way relief valve 112 may be other than as shown, as long as each permits fluid communication with sealed compartment 84. Also, the example air purge or pressurization system 108 is shown as including mechanical controls, but it will be appreciated that alternative configurations of an air purge or pressurization system may be utilized.

Such an air purge or pressurization system 108 may be used in at least three ways. First, it may be used to subject the sealed compartment 84 to a sustained, low positive air pressure via supply of pressurized clean air via inlet conduit pipe 110 to ensure that no explosive vapors or contaminated environmental or ambient air may be drawn into the sealed compartment 84. Second, it may be used after servicing the electrical control panel 10 if the enclosure box 12 has been opened or separated from the second heat exchanger 70, so that upon resealing the sealed compartment 84 any air that may have been captured therein may be purged and replaced with clean air before restarting operation of the electrical control panel 10. Third, it may be used to periodically purge or flush the air from the sealed compartment 84 and replace it with clean air from the pressurized source supplied via the inlet conduit pipe 110, so as to ensure that a new volume of clean air will be present within the sealed compartment 84.

From the above disclosure, it will be apparent that an electrical control panel with cooling system in accordance with this disclosure may include a number of structural aspects that provide advantages over prior art cooling of electrical control panels, depending upon the specific design chosen.

It will be appreciated that an electrical control panel may be embodied in various configurations. Any variety of suitable materials of construction, configurations, shapes and sizes for the components and methods of connecting the components may be utilized to meet the particular needs and requirements of an end user. It will be apparent to those skilled in the art that various modifications can be made in the design and construction of such an electrical control panel without departing from the scope or spirit of the claimed subject matter, and that the claims are not limited to the preferred embodiment illustrated herein.

The invention claimed is:

1. An electrical control panel comprising:
an enclosure box having an outer body having a body inlet opening and a body outlet opening, wherein the outer body is sealed such that internal air can only enter or exit through the body inlet and outlet openings in the outer body;
a primary electrical component mounted inside the enclosure box and having a first heat exchanger that transfers heat generated by the primary electrical component to the internal air surrounding the primary electrical component and the first heat exchanger;
one or more secondary electrical components mounted inside the enclosure box with each of the one or more secondary electrical components generating less heat when operating than the heat generated by the primary electrical component when operating;
a second heat exchanger attached to the enclosure box and having an internal air passageway that includes an inlet opening and an outlet opening;
wherein the inlet opening of the internal air passageway of the second heat exchanger is in fluid communication with the body outlet opening of the enclosure box such that the internal air can pass from the enclosure box into the internal air passageway of the second heat exchanger;
wherein the outlet opening of the internal air passageway of the second heat exchanger is in fluid communication with the body inlet opening of the enclosure box such that the internal air can pass from the internal air passageway of the second heat exchanger into the enclosure box;
wherein the internal air passageway of the second heat exchanger is sealed such that the internal air can only enter or exit through the inlet and outlet openings of the internal air passageway of the second heat exchanger;
wherein the second heat exchanger further comprises a heat transfer element and at least one fan that circulates the internal air through the internal air passageway of the second heat exchanger and across or through the heat transfer element of the second heat exchanger thereby reducing a temperature of the internal air circulated through the internal air passageway of the second heat exchanger;
wherein the outer body of the enclosure box and the internal air passageway of the second heat exchanger together define a sealed compartment relative to ambient air around an outside of the enclosure box and internal air passageway of the second heat exchanger; and one or more air diverter elements that direct a majority of the internal air as heated internal air exiting an outlet opening of the first heat exchanger to enter the inlet opening of the internal air passageway of the second heat exchanger and to avoid contacting at least one of the one or more secondary electrical components, and wherein each of said at least one of said one or more secondary electrical components is contacted by the internal air exiting the outlet opening of the internal air passageway of the second heat exchanger.

2. The electrical control panel of claim 1 wherein the enclosure box is sealed with respect to outside vapors or moisture.

3. The electrical control panel of claim 1 wherein the primary electrical component is an adjustable-speed motor drive.

4. The electrical control panel of claim 1 wherein the first heat exchanger has a heat transfer element and at least one fan that circulates the internal air across or though the heat transfer element of the first heat exchanger.

5. The electrical control panel of claim 4 wherein a flow of the internal air across the first heat exchanger is less than a flow of the internal air across or through the heat transfer element in the internal air passageway of the second heat exchanger.

6. The electrical control panel of claim 1 wherein the first heat exchanger is integrated with or dedicated to the primary electrical component.

7. The electrical control panel of claim 1 wherein the one or more diverter elements further comprise one or more drive subpanels, one or more logic subpanels, one or more air panels or one or more blocks, the one or more diverter elements mounted within the enclosure box.

8. The electrical control panel of claim 1 wherein air flow through the enclosure box is adjustable by movement of the one or more diverter elements.

9. The electrical control panel of claim 1 wherein the majority of the heated internal air exiting the outlet opening of the first heat exchanger and being directed to enter the inlet opening of the internal air passageway of the second heat exchanger avoids contacting all of the one or more secondary electrical components.

10. The electrical control panel of claim 1 wherein the outer body of the enclosure box has an internal volume of V cubic meters and the primary electrical component generates an average heat of W watts when operating, wherein when the primary electrical component is operating there is a ratio of the generated average heat W of the primary electrical component to the internal volume V of the enclosure box of at least 1500 watts/cubic meter.

11. The electrical control panel of claim 1 further comprising an air purge system including an inlet conduit pipe and one-way relief valve each connected to and in fluid communication with the sealed compartment.

12. An electrical control panel comprising:
an enclosure box having an outer body having a body opening and a body opening, wherein the outer body is sealed such that air can only enter or exit through the body inlet and outlet openings in the outer body;
a plurality of electrical components mounted within the enclosure box;
the plurality of electrical components including a primary electrical component having a first heat exchanger having a first inlet opening and a first outlet opening;
a separate second heat exchanger having an internal air passageway being connected to and in fluid communication with the enclosure box which defines a sealed compartment therewith, and the internal air passageway of the second heat exchanger having a second inlet opening and a second outlet opening, wherein the second heat exchanger cools the air received in the second inlet opening of the internal air passageway from the first outlet opening of the first heat exchanger and from the air otherwise passing through the enclosure box and forces the cooled air to exit the second outlet opening of the internal air passageway of the second heat exchanger and to enter the body inlet opening of the outer body of the enclosure box and flow within the enclosure box with some of the cooled air passing through the first heat exchanger; and
one or more air diverter elements mounted within the enclosure box that direct a majority of the air as heated air exiting the first outlet opening of the first heat exchanger to enter the second inlet opening of the internal air passageway of the second heat exchanger without flowing over at least one secondary electrical component of the plurality of electrical components, and wherein said at least one secondary electrical component is contacted by the air exiting the second outlet opening of the internal air passageway of the second heat exchanger.

13. The electrical control panel of claim 12 wherein the one or more diverter elements further comprise one or more drive subpanels, one or more logic subpanels, one or more air panels or one or more blocks, the one or more diverter elements mounted within the enclosure box.

14. The electrical control panel of claim 12 wherein the enclosure box is sealed with respect to outside vapors or moisture.

15. The electrical control panel of claim 12 wherein the first heat exchanger has a first heat transfer element and at least one first fan that circulates the air across or though the first heat transfer element, wherein the second heat exchanger further comprises a second heat transfer element and at least one second fan that circulates the air through the internal air passageway of the second heat exchanger and across or through the second heat transfer element, and a flow of the air across the first heat exchanger is less than a flow of the air across the second heat exchanger.

16. The electrical control panel of claim 12 wherein the outer body of the enclosure box has an internal volume of V cubic meters and the primary electrical component generates an average heat of W watts when operating, wherein when the primary electrical component is operating there is a ratio of the generated average heat W of the primary electrical component to the internal volume V of the enclosure box of at least 1500 watts/cubic meter.

17. An electrical control panel comprising:
an enclosure box having an outer body having a body inlet opening and a body outlet opening, wherein the outer body is sealed such that air can only enter or exit through the body inlet and outlet openings in the outer body;
a primary electrical component mounted inside the enclosure box and having a first heat exchanger having a first heat transfer element and at least one first fan that transfers heat generated by the primary electrical component to the internal air surrounding the primary electrical component and the first heat exchanger;
one or more secondary electrical components mounted inside the enclosure box with each of the one or more secondary electrical components generating less heat when operating than the heat generated by the primary electrical component when operating;

a second heat exchanger attached to the enclosure box and having an internal air passageway that includes an inlet opening and an outlet opening;

wherein the inlet opening of the internal air passageway of the second heat exchanger is in fluid communication with the body outlet opening of the enclosure box such that the internal air can pass from the enclosure box into the internal air passageway of the second heat exchanger;

wherein the outlet opening of the internal air passageway of the second heat exchanger is in fluid communication with the body inlet opening of the enclosure box such that the internal air can pass from the internal air passageway of the second heat exchanger into the enclosure box;

wherein the internal air passageway of the second heat exchanger is sealed such that the internal air can only enter or exit through the inlet and outlet openings of the internal air passageway of the second heat exchanger;

wherein the second heat exchanger further comprises a second heat transfer element and at least one second fan that circulates the internal air through the internal air passageway of the second heat exchanger and across or through the second heat transfer element thereby reducing a temperature of the internal air circulated through the internal air passageway of the second heat exchanger;

wherein the outer body of the enclosure box and the internal air passageway of the second heat exchanger together define a sealed compartment relative to ambient air around an outside of the enclosure box and internal air passageway of the second heat exchanger;

wherein the at least one first fan of the first heat exchanger provides a flow of the internal air less than a flow of the internal air circulated by the at least one second fan through the internal air passageway of the second heat exchanger; and one or more air diverter elements that direct the internal air as heated internal air exiting a first outlet opening of the first heat exchanger to enter the inlet opening of the internal air passageway of the second heat exchanger.

18. The electrical control panel of claim 17 wherein the respective flows of the internal air through the first heat exchanger and through the internal air passageway of the second heat exchanger in combination with the one or more air diverter elements direct a majority of the heated internal air exiting the first heat exchanger to enter the inlet opening of the internal air passageway of the second heat exchanger and to avoid contacting at least one of the one or more secondary electrical components, and wherein said at least one of the one or more secondary electrical components is contacted by the internal air exiting the outlet opening of the internal air passageway of the second heat exchanger.

19. The electrical control panel of claim 17 wherein the one or more diverter elements further comprise one or more drive subpanels, one or more logic subpanels, one or more air panels or one or more blocks, the one or more diverter elements mounted within the enclosure box.

20. The electrical control panel of claim 17 further comprising an air purge system including an inlet conduit pipe and one-way relief valve each connected to and in fluid communication with the sealed compartment.

\* \* \* \* \*

UNITED STATES PATENT AND TRADEMARK OFFICE
CERTIFICATE OF CORRECTION

PATENT NO. : 11,342,731 B1  
APPLICATION NO. : 17/152489  
DATED : May 24, 2022  
INVENTOR(S) : Michael P. Thompson et al.

Page 1 of 1

It is certified that error appears in the above-identified patent and that said Letters Patent is hereby corrected as shown below:

On the Title Page

Item (71): "PeopieFlo Manufacturing, Inc." should be changed to --PeopleFlo Manufacturing, Inc.--

Signed and Sealed this  
Ninth Day of August, 2022

Katherine Kelly Vidal  
*Director of the United States Patent and Trademark Office*